United States Patent
Houge et al.

(10) Patent No.: US 6,708,574 B2
(45) Date of Patent: Mar. 23, 2004

(54) ABNORMAL PHOTORESIST LINE/SPACE PROFILE DETECTION THROUGH SIGNAL PROCESSING OF METROLOGY WAVEFORM

(75) Inventors: Erik Cho Houge, Orlando, FL (US); Scott Jessen, Orlando, FL (US); John Martin McIntosh, Orlando, FL (US); Catherine Vartuli, Windermere, FL (US); Fred Anthony Stevie, Orlando, FL (US)

(73) Assignee: Agere Systems, Inc., Allentown, PA (US)

( * ) Notice: Subject to any disclaimer, the term of this patent is extended or adjusted under 35 U.S.C. 154(b) by 54 days.

(21) Appl. No.: 10/156,242

(22) Filed: May 24, 2002

(65) Prior Publication Data

US 2003/0219916 A1 Nov. 27, 2003

(51) Int. Cl.$^7$ ............................................. G01M 19/00
(52) U.S. Cl. ................... 73/865.8; 250/491.1
(58) Field of Search ........................ 438/14; 156/643; 250/491.1; 73/865.8; 356/358

(56) References Cited

U.S. PATENT DOCUMENTS

| | | | | |
|---|---|---|---|---|
| 4,983,253 A | * | 1/1991 | Wolfe | 156/643 |
| 5,969,273 A | * | 10/1999 | Archie | 73/865.8 |
| 6,407,396 B1 | * | 6/2002 | Mih | 250/491.1 |

* cited by examiner

*Primary Examiner*—John F. Niebling
*Assistant Examiner*—Andre C Stevenson
(74) *Attorney, Agent, or Firm*—James H. Beusse; Beusse Brownlee Bowdoin & Wolter, P.A.

(57) ABSTRACT

A semiconductor manufacturing automation method for analyzing a patterned feature formed on a semiconductor layer is disclosed. At least one patterned feature is scanned to generate an amplitude modulated waveform signal of the line and neighboring space characteristics. Signal processing is automatically performed on this waveform by an in-line computational source to extract known patterned features based on the profile of the amplitude modulated waveform signal. The extracted waveform segments are subjected to known geometric shapes to determine if the waveform indicates a normal or abnormal patterned feature on a semiconductor layer.

11 Claims, 7 Drawing Sheets

ABNORMAL PHOTORESIST LINE/SPACE PROFILE DETECTION THROUGH SIGNAL PROCESSING OF METROLOGY WAVEFORM

FIELD OF THE INVENTION

This invention relates in general to the field of semiconductor manufacturing. More particularly, this invention relates to method for analyzing a semiconductor surface with patterned features using line width metrology.

BACKGROUND OF THE INVENTION

Semiconductor manufacturing consists of a number of crucial processing steps performed on wafer lots. Fabrication processes use tools that communicate in a manufacturing framework or network. This network along with manufacturing model script software establishes a process control system. As semiconductive materials are staged through processes in this system, data relating to quality is collected. Frequent processing errors are typical in this system, which causes appreciable inconsistencies in critical dimensions of semiconductive material.

Once the wafers have patterned features, analysis of semiconductor surface quality can be performed using line width metrology. Manufacturing issues often result in inferior quality of a feature's sidewalls. Additionally, it is desirable that there be a minimal amount of scumming and residual at the bottom of a feature. As the number of features on a substrate and the complexity of the features increase, methods must be developed to ensure that user specified critical dimensions can be consistently and accurately achieved. The need for error reduction also increases substantially as technology facilitates smaller critical dimensions for semiconductive devices.

One approach has been to utilize software to compare critical dimensions of waveform profiles to a known master database of deviant profiles. In this approach, critical dimensions for all possible defects must be captured and archived in the database through an exhaustive range of both shapes and scales. Each waveform is unique to the technology and metrology tool used. The database must be vigorously maintained for each geometry and substrate as well. The software can identify any correlation of a whole signal profile to one found in the database. Detection requires whole signal correlation and does not accommodate for variations in scale as well as unarchived shapes. This solution results in a high degree of false detections. Due to inadequate performance, this method has not been implemented in a fabrication facility.

Other traditional in-line metrology measures a photoresist line width regardless of the semiconductor profile. However, a profile strongly influences the pattern transfer and needs to be accounted for in small device geometries. This invention enables the recognition of abnormal profiles, ranks the deviation magnitude, and enables the in-line metrology system to correct the root cause before committing lots to etch.

SUMMARY OF THE INVENTION

An object of the present invention is to streamline semiconductor-manufacturing processes, increase product yield rates, solve the need for greater precision, and induce process reliability/repeatability by automating processes thus reducing the need for human involvement.

Another object of the present invention is to provide a method for automatically determining acceptability of a semiconductor surface having a patterned feature using line width metrology signal processing.

Another object of this invention is to recognize and respond to the scumming defect where spaces are not adequately cleared between lines.

Another object of the present invention is to provide universal applicability to a wide range of technologies, metrology tools, and process control systems via the application of the method disclosed of applying a curve-fit function to known signal characteristics which is independent of process variations of both shape and scale.

Yet another object of the present invention is to provide a solution that does not need to "learn" what a normal waveform profile is as it depends on scale independent numerical relations to detect specific features by using known geometric shapes to determine the presence of specific features.

In accordance with the present invention, the disclosed method enables process automation for semiconductor fabrication by employing geometric shapes also known as curve-fit functions to analyze a semiconductor surface quality using line width metrology. This is accomplished by analyzing a patterned feature formed on a semiconductor layer. At least one patterned feature is scanned to generate an amplitude modulated waveform signal of the line and neighboring space characteristics. Signal processing is automatically performed on this waveform by an in-line computational source to extract known patterned features based on a profile of the amplitude modulated waveform signal. Software performs the classification thus automating the process. The extracted waveform segments are subjected to curve-fit functions to determine if the waveform indicates a normal or abnormal patterned feature on a semiconductor layer which relates directly to acceptability of the patterned feature quality. Once the waveform has been classified a lot of wafers being processed can be dispositioned for further processing or rework (i.e., acceptable or not acceptable).

BRIEF DESCRIPTION OF THE DRAWINGS

The features of the invention believed to be novel are specifically set forth in the appended claims. However, the invention itself, both as to its structure and method of operation, may best be understood by referring to the following description and accompanying drawings.

DETAILED DESCRIPTION OF THE INVENTION

Scanning electron microscopes (SEM) and similar line width metrology tools are typically utilized to obtain critical dimension (CD) data in semiconductor manufacturing processes. Once data is obtained it must be accurately analyzed to disposition the semiconductive material being processed. It is difficult and inefficient for an operator to detect issues by simply viewing data obtained from a metrology tool. Methodologies for testing wafers during the manufacturing process are becoming increasingly important as devices are produced in smaller, tighter wafer configurations. Greater efficiency and increased accuracy demands are addressed by the invention disclosed through automating the semiconductor surface evaluation process.

The SEM produces data representing ion beam reflection from each increment of surface being scanned. This data is readily converted to an analog signal of the type illustrated in FIG. 3 where the amplitude of the signal represents the intensity of ion reflection. The reflected intensity varies depending on the material and depth of features on the surface. Flat surfaces tend to reflect less than corners since ions can escape from both top and side surfaces at corners. Reflection within recesses drops off due to capture of ions in side walls of the recesses.

The disclosed method automates semiconductor fabrication processing by employing mathematical representations of known geometric shapes to analyze a semiconductor surface quality using line width metrology applied to an analog signal representative of ion beam reflection intensity.. A semiconductor surface having patterned features, such as photoresist, is analyzed by scanning at least one patterned feature to produce a scanned waveform signal. Segments of the waveform signal correspond to characteristic surface portions of the patterned feature. These signal segments are processed using a known geometric shape of a plurality of known geometric shapes to analyze the acceptability of patterned features thus automating the process of determining the surface quality of the semiconductive material. Acceptability relates the case of a waveform as acceptable for the "normal" condition. Conversely, acceptability relates the case of an "abnormal" waveform as not acceptable. The known geometric shapes are also referred to as curve-fit functions. Detection of a normal waveform validates the wafer lot is of acceptable quality for continued fabrication. Upon an abnormal waveform being detected, a wafer lot of inferior-quality wafers can be intercepted prior to investing further processing resources thus increasing the manufacturing yield of quality devices.

Figure 1:
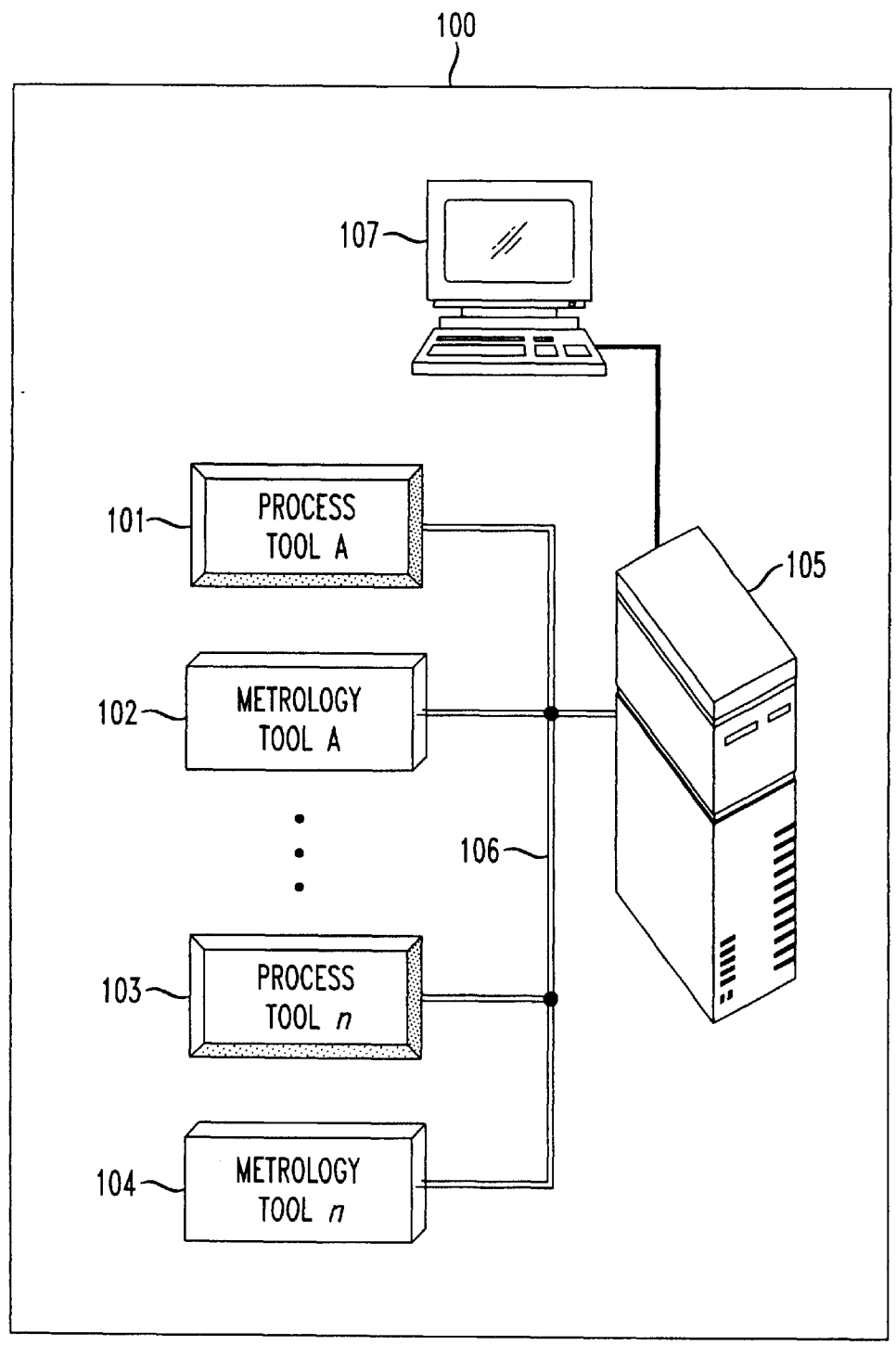
FIG. 1 is a block diagram representation of a manufacturing system.

A simplified block diagram of a semiconductor wafer processing system 100 is provided in FIG. 1 where at least some of the teachings of the present invention is employed for process automation. A computer system 105, 107 interfaces with processing and metrology tools as semiconductor wafers are processed. Processing tools 101, 103 such as a stepper or etch processing tool and metrology tools 102, 104 such as a critical dimension measurement tool (e.g., a scanning electron microscope) interface with the computer system 105 via network communications links 106. Communications include a plurality of control input signals and data. The computer system 105 utilizes software programs to control the manufacturing processes and collect pertinent data.

A representative manufacturing flow of this system supports control input signals on a line 106 that are intended for Processing Tool A 101. As part of wafer fabrication at this stage, Metrology Tool A 102 provides data inputs to the computer system 105 (i.e. Controller) via a communications link 106. In a preferred embodiment, the computer system 105 utilizes a control algorithm that is capable of making feedback-control adjustments to the manufacturing processes performed by Processing Tool A 101 in response to processing data acquired by any prior processes and Metrology Tool A 102. The manufacturing flow continues in a repetitive manner for additional stages of wafer manufacturing that is represented by Processing Tool n 103 coupled with Metrology Tool n 104.

Figure 2:
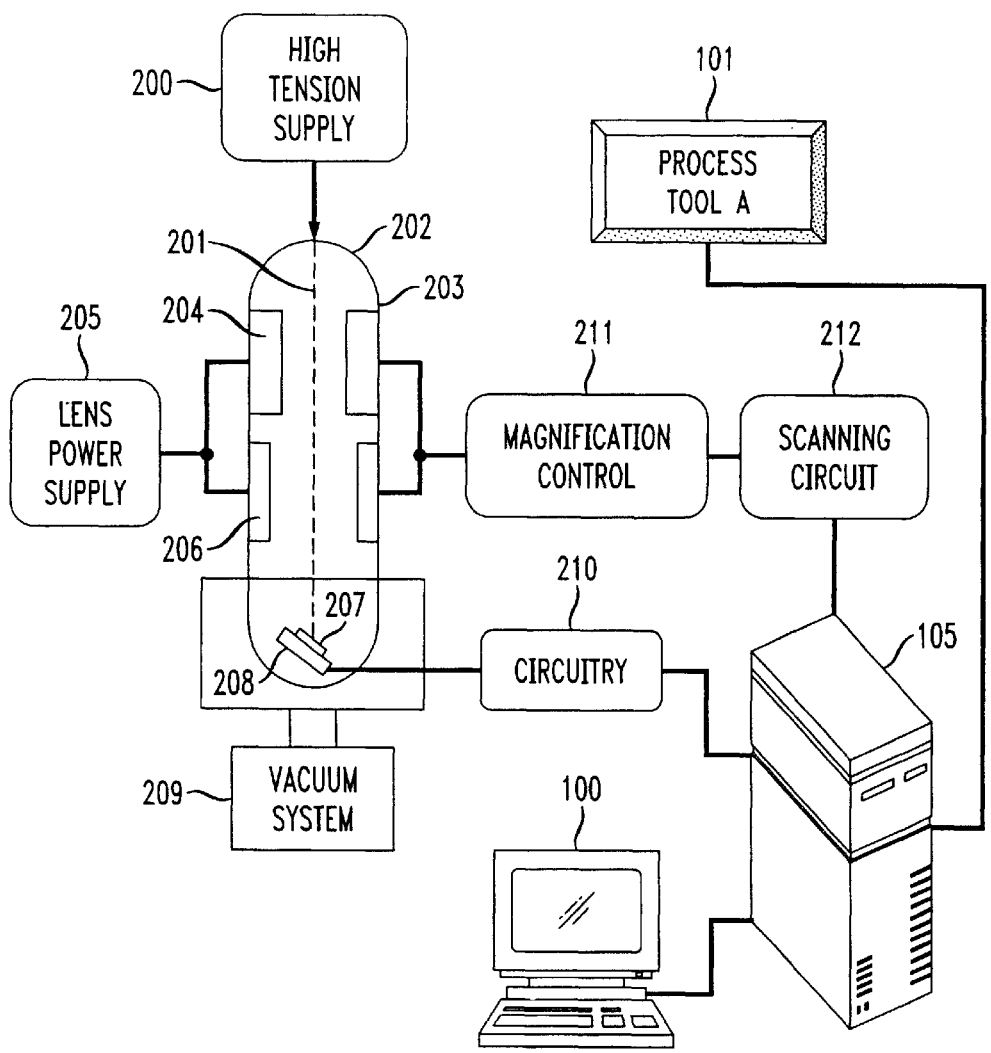
FIG. 2 is a block diagram of a sub-system representation within the manufacturing system.

Further examination of a semiconductor wafer processing system 100 is depicted in FIG. 2, where a preferred embodiment of the present invention employs a scanning electron microscope as the critical dimension (CD) metrology tool. The scanning electron microscope 202 includes a housing 203 containing appropriate Lenses 204,206 for processing being performed and forming an Electron Beam Channel 201. A high-tension supply 200 provides power through the electron beam column. A Lens Power Supply 205 provides control of the electron beam that hits a Wafer 207 located on an Electron Collector 208. A vacuum is maintained in the Housing 203 via a Vacuum System 209. Electrons are collected and sent through Circuitry 210 and into a Controller 105, which forms an image. Controller 105 processes the image and calculates its shape and scale. Adjustments to Processing Tool A 101 could be identified and communicated via Controller 105. The Controller 105 also controls Scanning Circuitry 212 and a Magnification Controller 211.

As known to those skilled in the art, critical dimension or CD metrology, such as line width of patterned conductors and line spacing metrology, attempts to relate an intensity signal or amplitude modulated waveform signal to the actual size of the feature, known as scale. The intensity signal in the form of an amplitude modulated waveform signal is usually visualized and manipulated as a profile or waveform. CD line width metrology relates an intensity signal produced from a line width metrology device to the actual size or scale of a patterned feature, such as a photoresist feature produced on a semiconductor layer. This is accomplished by scanning across a patterned feature and generating an amplitude modulated waveform signal as a function of detected electrons reflected from patterned features such as lines. Traditional line width metrology typically ignores effects caused by patterned feature shape variations. However, the shape must often be determined due to its adverse effects on further processing of a semiconductor wafer.

Figure 3:
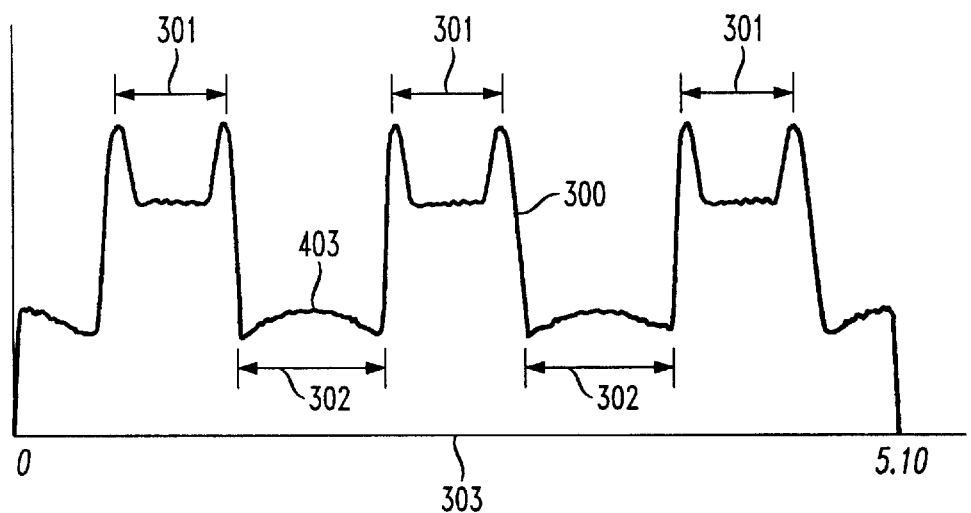
FIG. 3 is a normal intensity trace waveform with characteristics identified.
Figure 4:
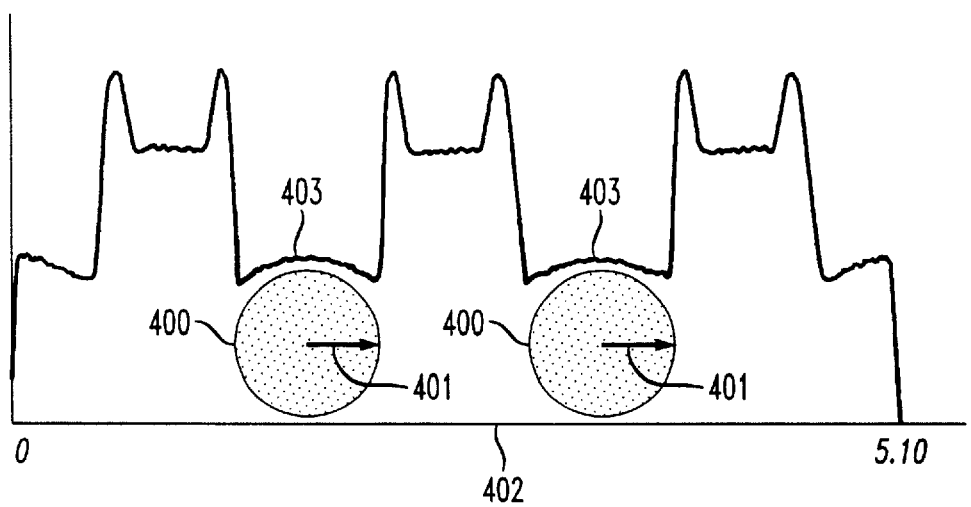
FIG. 4 is a normal intensity trace waveform with characteristics shapes identified as they relate to curve-fit functions.

FIGS. 3 and 4 represent a well-tuned waveform signal depicting a scan profile from which the CD line width of a patterned feature can be determined. FIGS. 3 and 4 show "normal" intensity trace waveforms where the wave trace segments 301 represent conductor line features and wave trace segments 302 represent space features between the lines. The plot dimension along the x-axes 303, 402 is depicted in inches although the actual dimensions of the wafer features are typically in microns. The normal intensity trace waveform depicted illustrates fairly uniform sidewalls of the spaces by near vertical waveform segments 300. The bottom of each space is ideally flat and is characterized by a waveform segment 403 having a convex shape corresponding to an arc of a circle 400 which, in this instance, comprises a known geometric shape. This known geometric shape is utilized to analyze the waveform. Examples of known characteristics that are present in normal waveforms include:

Space feature sidewalls waveform segments 300 that are uniform and quasi-parallel, i.e., near vertical.

Space feature bottom waveform segments 403 having a convex uniform arc characteristic that can be associated to a circle or defined by a radius vector 401 indicative of appropriate shape and size.

Figure 5:
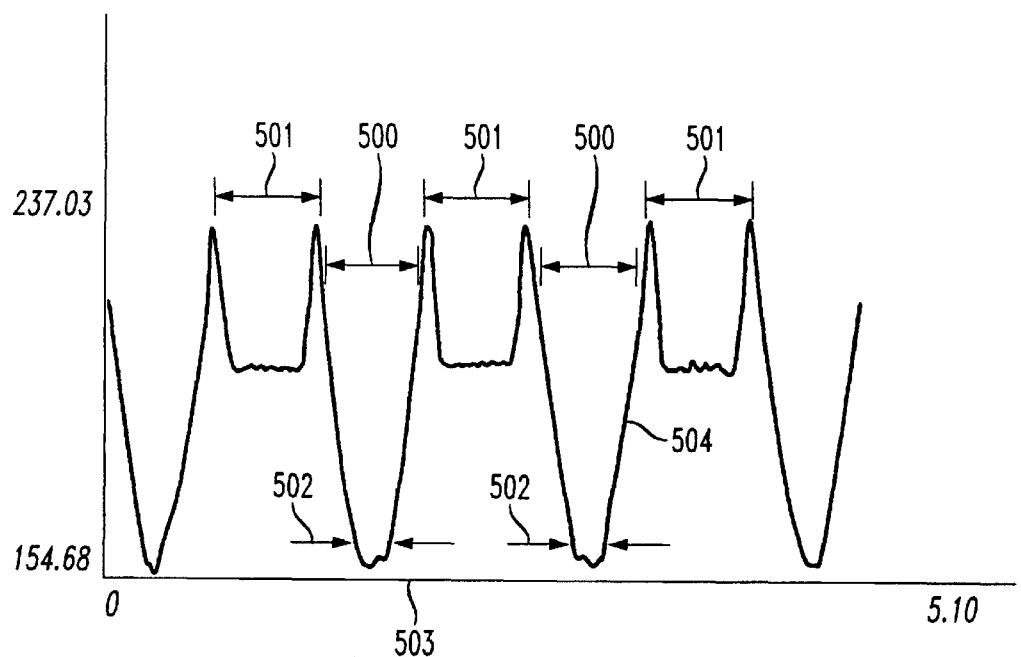
FIG. 5 is an abnormal intensity trace waveform with characteristics identified.
Figure 6:
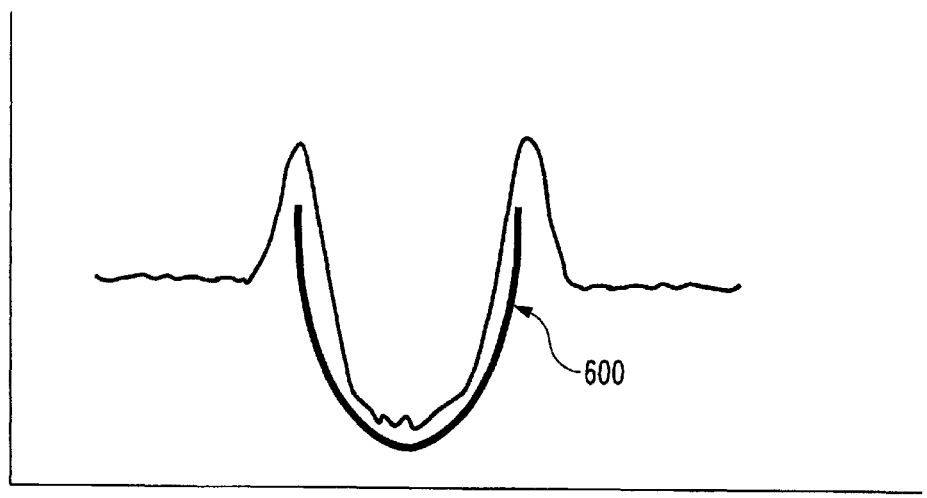
FIG. 6 is an abnormal intensity trace waveform segment indicating a parabolic characteristic.

FIGS. 5 and 6 show segments of an abnormal trace waveform depicting a profile from which the CD line width of a patterned feature can be determined. The plot dimension 503 along the x-axis is in inches. The waveform indicates the presence of a condition known by those skilled in the art as "scumming" or "footing", which is a defect where spaces are not adequately cleared between conductor lines. The waveform segments represented by the time intervals 501 correspond to conductor lines. The waveform segments between intervals 501 correspond to spaces between the conductor lines where etching has been used to create line shapes. Note that the profile segments 504 taper toward a narrow bottom segment at 502 so that the width at 500 is greater than the bottom width 502. Further, as shown more clearly in FIG. 6, the bottom of each space segment profile is concave and can be characterized by a U-shaped profile 600.

Examples of known characteristics present in abnormal waveforms for this type of pattern of lines and spaces include:

Space features conform to a known geometric shape 600 such as a positive parabolic shape.

Width 502 at a bottom of a space segment profile is typically much smaller than the corresponding width 500 at a top of the space segment profile;

The width 502 is a measure of the magnitude of the abnormality; and

A width 502 less than the space width 500 is indicative of scumming or footing.

Figure 7:
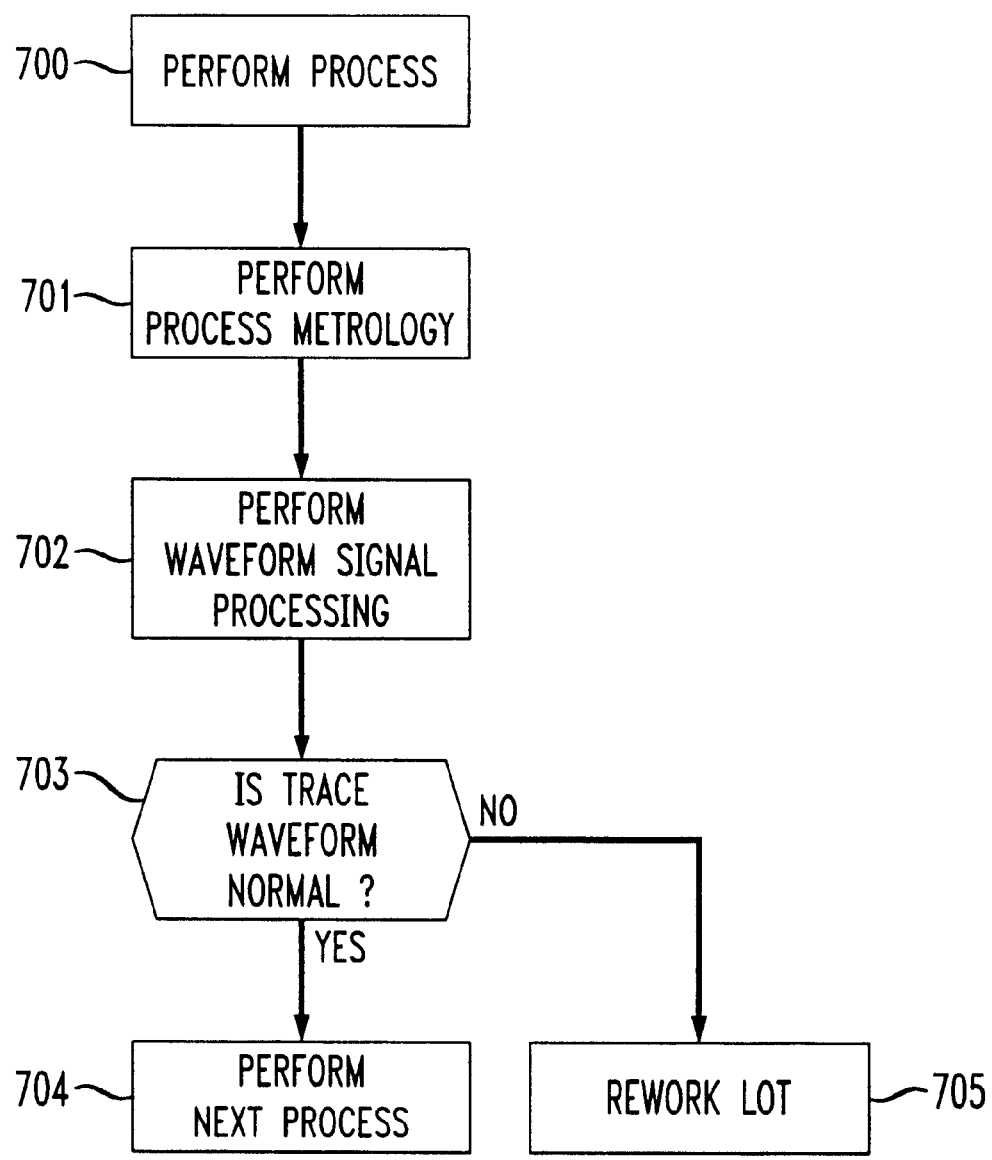
FIG. 7 is flow diagram of a waveform classification process.

The present invention leverages the fact that known waveform characteristics can be identified and used to classify the quality of semiconductor wafers prior to committing the lot to further processing. A preferred embodiment of this invention uses software to apply algorithms that are comprised of mathematical representations of known "normal" and "abnormal" characteristics, such as curve-fit functions, in order to determine if the quality of semiconductor devices being processed is acceptable or should be rejected. A flow diagram for software that would reside in a Controller 105 for waveform metrology processing is provided in FIG. 7. In-line semiconductor processing is performed, block 700, along with the associated CD metrology process, block 701, from which line-space profile waveforms are generated. Signal processing, block 702, is performed on these waveforms to analyze their attributes. A check is performed to determine if a waveform currently being analyzed possesses "normal" attributes, block 703. If "normal" attributes are present, the waveform is classified as "normal"; the lot of wafers is submitted to the next processing step, block 704 (e.g., etching). However, if the waveform was not classified as "normal", it is submitted for further processing to determine if it possesses "abnormal" attributes. If the waveform possesses "abnormal" attributes, it is classified as "abnormal" indicating that the wafer lot will need to be reworked, block 705.

Figure 8:
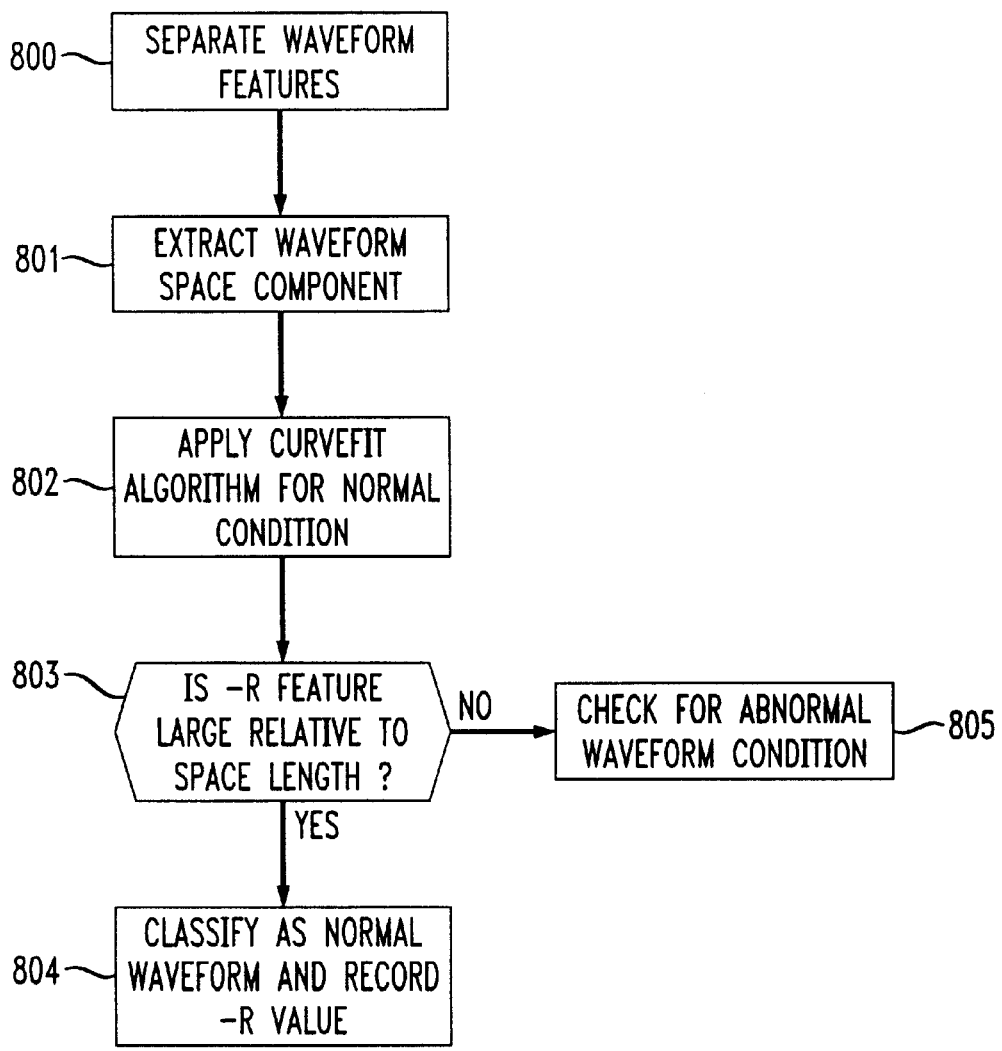
FIG. 8 is a flow diagram of waveform metrology processing for a normal condition.

FIG. 8 details waveform processing to determine if a waveform being processed possesses attributes that classify it as a normal waveform. Waveform features are separated, block 800, into known characteristics (e.g., space segment, line segment). The waveform space segment is extracted, block 801, for further processing. Characteristics of the space segment are determined by applying a curve-fit algorithm to the extracted segment elements of the waveform, block 802. The curve-fit algorithm attempts to correlate a derived radius (i.e., positive or convex radius as depicted in FIG. 4) to the extracted space segment of the waveform. If the curve-fit function successfully defines a radius value (convex curve-fit, e.g., a circle arc), it is compared to the space width, such as width 302 as defined in FIG. 3. If the radius is relatively large compared to the space width, block 803, then waveform characteristics are classified as normal, block 804, and the lot is automatically submitted for further processing, block 704. However, if the curve-fit algorithm was unsuccessful (i.e., a large convex radius characteristic relative to the space width does not exist in the waveform being analyzed) then a check for an abnormal waveform condition, block 805, is performed.

Figure 9:
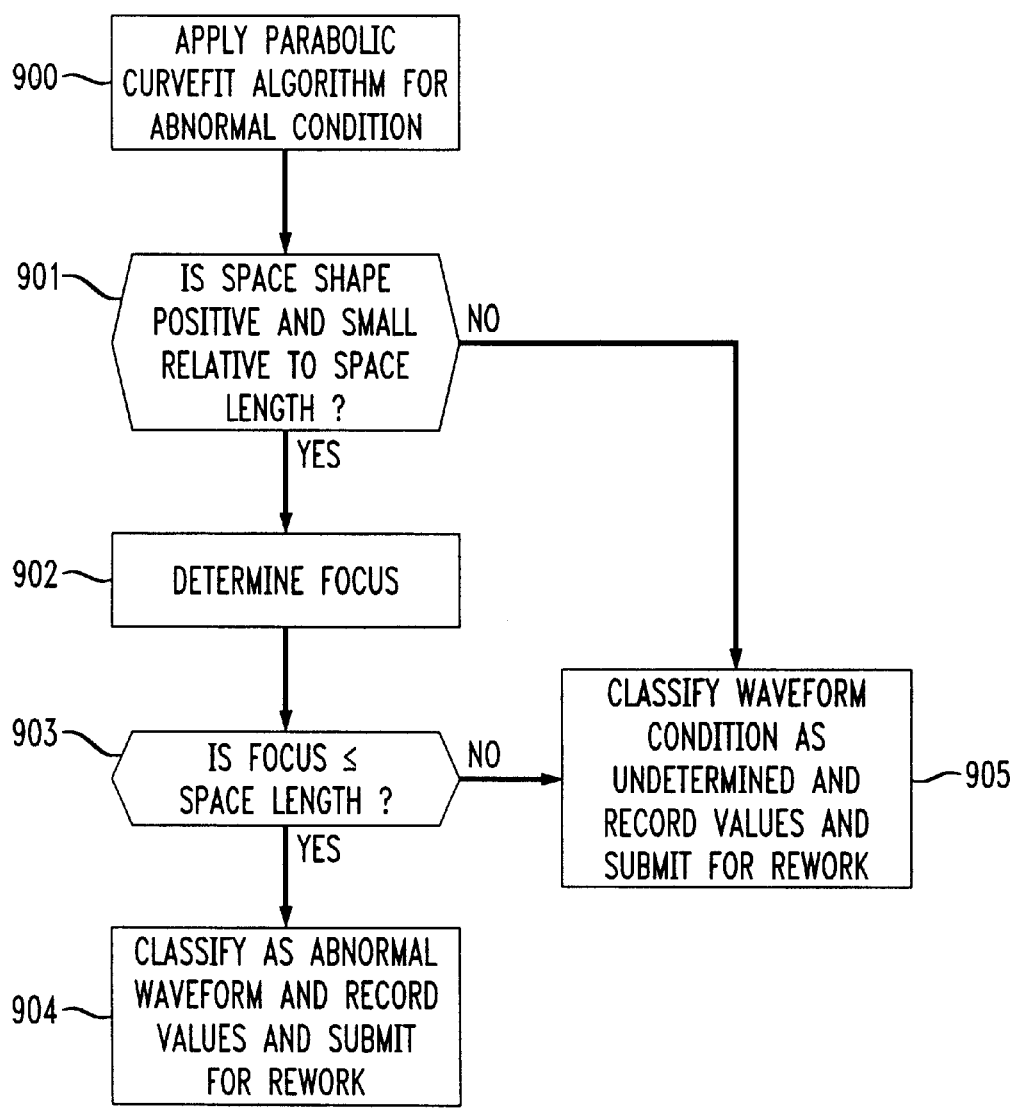
FIG. 9 is a flow diagram of waveform metrology processing for an abnormal condition.

Abnormal waveform processing is defined in the flow diagram of FIG. 9. To determine if an abnormal space segment profile exists in the waveform being analyzed, a parabolic curve-fit function is correlated to the space segment extracted, block 900 (refer to FIG. 6). The parabolic curve-fit is represented in the following equation:

$$Y = \frac{X^2}{4F},$$

where F is width indicated by dimension 302 in FIG. 3 or dimension 502 in FIG. 5.

A test is performed to determine if a positive parabolic characteristic exists in the space segment being processed, block 901. This test also compares the width of the parabolic shape to the space width. If the space shape is relatively small compared to the space length and possesses a positive parabolic shape as indicated in FIG. 6, then the focus length is calculated, block 902 (see FIG. 5). If the focus length is less than or equal to the space width, block 903, then the waveform is classified as "abnormal", block 904, and the lot is automatically categorized to be reworked, block 705. If abnormal waveform conditions are not present during this processing, the waveform data is recorded and the lot is automatically categorized to be reworked, block 905.

The invention taught has a universal applicability to a wide range of technologies, metrology tools, and process control systems. The method of applying a geometric shape or curve-fitting algorithm is independent of process variations, shape deviations, and scale variations enable process automation. The present invention does not need to "learn" exhaustive instances of "normal" and "abnormal" profile characteristics due to applying curve-fit functions. Process automation applying the method disclosed yields a more effective manufacturing solution.

While only certain preferred features of the invention have been shown by way of illustration, many modifications and changes will occur to those skilled in the art. It is, therefore, to be understood that the present claims are intended to cover all such modifications and changes, which fall within the true spirit of the invention.

What is claimed is:

1. A computerized method for analyzing a semiconductor wafer during fabrication, the method comprising:

scanning at least one of a plurality of patterned features on a semiconductor wafer surface to generate an amplitude modulated waveform signal representative of surface characteristics of the features;

extracting elements of the waveform signal corresponding to geometric shapes of the waveform signal between edges of the patterned features and comparing the extracted elements to predetermined desirable geometric characteristics associated with the extracted elements to determine acceptability of the feature.

2. The method of claim 1 wherein the step of scanning includes scanning with a scanning electron beam microscope (SEM) to produce a surface image and the step of generating comprises converting the SEM image to the amplitude modulated waveform.

3. The method of claim 2 wherein the surface characteristics comprise line width and line spacing.

4. The method of claim 2 wherein the geometric characteristics comprise parabolic and circular shapes.

5. The method of claim 3 and including the step of comparing width of the waveform feature corresponding to line spacing at about a widest point to a width of such feature at about a narrowest point.

6. The method of claim 3 wherein the step of comparing comprises curve-fitting the extracted waveform elements to waveform elements characteristic of idealized surface features.

7. The method of claim 6 wherein the step of curve-fitting comprises an analysis of waveform features corresponding to line spacing to evaluate uniform and quasi-parallel feature sidewalls.

8. The method of claim 6 wherein the step of curve-fitting comprises an analysis of waveform features corresponding to line spacing for a convex lowest point.

9. The method of claim 1 wherein the at least one of the patterned features comprises an etched space between patterned conductors and the extracted elements represent ion beam reflection from within the space.

10. The method of claim 9 and including identifying a ratio of a width of spacing of segments of the amplitude modulated waveform at top and bottom levels to determine feature acceptability.

11. The method of claim 9 and including comparing a bottom of a feature element corresponding to a space between patterned conductors to a circular shape to determine feature acceptability.

* * * * *